(12) United States Patent
Liu et al.

(10) Patent No.: US 9,577,074 B2
(45) Date of Patent: Feb. 21, 2017

(54) METHOD FOR MANUFACTURING FINFET

(71) Applicant: Institute of Microelectronics, Chinese Academy of Sciences, Beijing (CN)

(72) Inventors: Yunfei Liu, Beijing (CN); Haizhou Yin, Poughkeepsie, NY (US); Keke Zhang, Shandong (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/905,465

(22) PCT Filed: Oct. 22, 2013

(86) PCT No.: PCT/CN2013/085619
§ 371 (c)(1),
(2) Date: Mar. 25, 2016

(87) PCT Pub. No.: WO2015/051560
PCT Pub. Date: Apr. 16, 2015

(65) Prior Publication Data
US 2016/0276467 A1  Sep. 22, 2016

(30) Foreign Application Priority Data
Oct. 13, 2013 (CN) .......................... 2013 1 0477088

(51) Int. Cl.
*H01L 29/49* (2006.01)
*H01L 29/66* (2006.01)
(Continued)

(52) U.S. Cl.
CPC . *H01L 29/66795* (2013.01); *H01L 21/823418* (2013.01); *H01L 21/823431* (2013.01);
(Continued)

(58) Field of Classification Search
CPC .................. H01L 29/66795; H01L 21/823418; H01L 29/785; H01L 21/823431; H01L 29/7853; H01L 29/66545; H01L 29/0649; H01L 29/4966
See application file for complete search history.

(56) References Cited

U.S. PATENT DOCUMENTS 8,071,983 B2    12/2011  Brask et al.
8,592,280 B2 *  11/2013  Chang ............... H01L 29/66545
                                                                257/346
(Continued)

FOREIGN PATENT DOCUMENTS

CN    101199042 B    5/2011
TW    201334119 A    8/2013

OTHER PUBLICATIONS

International Search Report and Written Opinion mailed on May 26, 2014 in International Application PCT/CN2013/085619.

*Primary Examiner* — Savitr Mulpuri
(74) *Attorney, Agent, or Firm* — Pillsbury Winthrop Shaw Pittman LLP

(57) ABSTRACT

A method of manufacturing a FinFET device is provided, comprising: a. providing a substrate (100); b. forming a fin (200) on the substrate; c. forming an shallow trench isolation structure (300) on the substrate; d. forming an sacrificial gate stack on the isolation structure, wherein the sacrificial gate stack intersects the fin; e. forming source/drain doping regions by ion implantation into the fin; f. depositing an interlayer dielectric layer (400) on the substrate; g. removing the sacrificial gate stack to form a sacrificial gate vacancy; h. forming an doped region (201) under the sacrificial gate vacancy; i. etching the shallow trench isolation structure (300) under the sacrificial gate vacancy until the top surface of the shallow trench isolation structure (300) levels with the bottom surface of the source/drain doping regions; j. form- (Continued)

ing a new gate stack in the sacrificial gate vacancy. Some advantages of the current invention may be, harmful effects produced in the source/drain regions by the triangle fin structure are eliminated, the device performance is improved, and the complexity of the process is reduce.

22 Claims, 6 Drawing Sheets

(51) Int. Cl.
H01L 21/8234 (2006.01)
H01L 29/78 (2006.01)
H01L 29/06 (2006.01)
(52) U.S. Cl.
CPC ...... *H01L 29/0649* (2013.01); *H01L 29/4966* (2013.01); *H01L 29/66545* (2013.01); *H01L 29/785* (2013.01); *H01L 29/7853* (2013.01)

(56) References Cited

U.S. PATENT DOCUMENTS

| | | | |
|---|---|---|---|
| 9,252,233 B2* | 2/2016 | Hsiao | H01L 29/515 |
| 9,331,079 B2* | 5/2016 | Han | H01L 21/32134 |
| 9,362,278 B1* | 6/2016 | Huang | H01L 27/0886 |
| 2005/0051825 A1* | 3/2005 | Fujiwara | H01L 29/41733 257/308 |
| 2005/0282342 A1 | 12/2005 | Adan | |
| 2012/0074386 A1* | 3/2012 | Rachmady | B82Y 10/00 257/24 |
| 2013/0198695 A1 | 8/2013 | Bryant et al. | |
| 2013/0270559 A1 | 10/2013 | Hafez | |
| 2014/0273379 A1* | 9/2014 | Tsai | H01L 29/66795 438/283 |
| 2016/0163832 A1* | 6/2016 | Yin | H01L 29/66545 257/401 |

* cited by examiner

METHOD FOR MANUFACTURING FINFET

CROSS REFERENCE TO RELATED APPLICATION

This application is a national stage application, filed under 35 U.S.C. §371, of PCT Application No. PCT/CN2013/085619, filed on Oct. 22, 2013, entitled "METHOD FOR MANUFACTURING FINFET", which claimed priority to Chinese Application No. 201310477088.1, filed on Oct. 13, 2013, all of which are hereby incorporated by reference in their entirety.

TECHNICAL FIELD

The present disclosure generally relates to a process of semiconductor manufacture, and in particular, to a method of manufacturing a FinFET.

BACKGROUND

With dimensional scaling of semiconductor device, some problems arises, for example, threshold voltage decreases with the reduction of channel length, current leakage increases, etc. In other word, short channel effects arise in semiconductor device. Fin field effect transistor, namely, FinFET is developed to face the challenge from semiconductor design and manufacturing.

A fin in a FinFET device is generally designed as a cuboid structure to optimize device performance, however, the fin of a cuboid structure is fragile with poor stress tolerance. A triangle fin is adopted in most semiconductor design, which increases difficulties in many process steps, such as fin etching and source/drain implantation etcetera. Specifically, in source/drain implantation, tilt ion implantation is employed to realize uniform doping profile in fin structure. However, the method is critically affected by fin height and space size between neighboring fins, which involves complex process steps and non-uniform doping profiles.

A novel source/drain doping method for FinFET is provided to resolve the foregoing problems, comprising: forming shallow trench isolation (STI) structures on a semiconductor base after fins formed, wherein the STI structures have a higher top surface than those fins, and then forming sacrificial gate stacks on the STI structures, forming source/drain regions below the gate stacks and just in both ends of the fins which is embedded in the STI structures, such that a similarly planar structure is formed. Therefore, vertical ion implantation can be employed in source/drain implantation in FinFET manufacturing. Using the method disclosed in the present invention, harmful effects produced in source/drain implantation by triangle fin structures can be effectively avoided, device performance can be optimized, and process complexity can be reduced.

SUMMARY

A method of manufacturing a FinFET device is provided in the present invention, and by this method, harmful effects produced in source/drain implantation by a triangle fin structure can be effectively avoided, device performance can be optimized, and process complexity can be reduced. Concretely, the method comprises: a. providing a substrate; b. forming a fin on the substrate; c. forming an shallow trench isolation structure on the substrate; d. forming an sacrificial gate stack on the isolation structure, wherein the sacrificial gate stack intersects the fin; e. forming source/drain doping regions by ion implantation into the fin; f. depositing an interlayer dielectric layer on the substrate; g. removing the sacrificial gate stack to form a sacrificial gate vacancy; h. forming a doped region under the sacrificial gate vacancy; i. etching the shallow trench isolation structure under the sacrificial gate vacancy until the top surface of the shallow trench isolation structure levels with the bottom surface of the source/drain doping regions; j. forming a new gate stack in the sacrificial gate vacancy.

In one aspect of the present invention, the top surface of the shallow trench isolation structure is higher than that of the fin by 5-10 nm, the shallow trench isolation structure is made of SiO2.

In another aspect of the present invention, the width of the sacrificial gate stack equals to the channel length in the fin.

In another aspect of the present invention, the etching depth is about 20-60 nm when etching the shallow trench isolation structure under the sacrificial gate vacancy.

In yet another aspect of the present invention, the doped region is under the sacrificial gate vacancy by a depth range of about 20-60 nm, an ion implantation process is employed to form the doped region, the doping type of the doped region is the same as that of the substrate, and the doping concentration is in a range of 1e18 $cm^{-3}$~1e19 $cm^{-3}$.

According to one aspect of the present invention, a novel FinFET manufacturing method is disclosed, comprising: forming shallow trench isolation (STI) structures on a semiconductor base after fins formed, wherein the STI structures have a higher top surface than those fins, and then forming sacrificial gate stacks on the STI structures, forming source/drain regions under the gate stacks and just in both ends of the fins which is embedded in the STI structures. Therefore, a similarly planar structure is formed. In the present invention, vertically ion implantation can be used to implement the source/drain doping and the under-channel doping to avoid punch through from the source region to the drain region. Employing the method disclosed in the present invention, harmful effects produced in source/drain implantation by a triangle fin structure can be effectively avoided, device performance can be optimized, and process complexity can be reduced.

DETAILED DESCRIPTION

Figure 2:
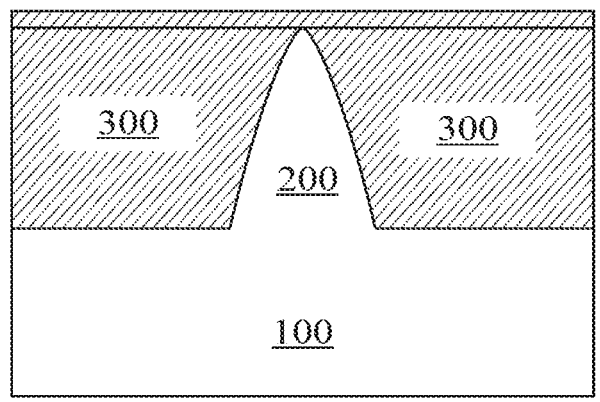
FIGS. 2, 4, 5, 6, 7, 8, 9 are schematic views illustrating some steps of a process for manufacturing a semiconductor fin structure in accordance with one embodiment of the present disclosure.

Referring to FIG. 2, a FinFET structure is provided in the present invention, which comprises: a substrate 100, a fin 200, a gate structure, a source region and a drain region, and a shallow trench isolation 300. The shallow trench isolation 300 may comprise $SiO_2$.

The substrate 100 comprises Silicon substrate (for example, silicon wafer). The substrate 100 may be doped in a variety arrangements. In other embodiments the substrate 100 may comprise other basic semiconductor materials, such as Ge or compound semiconductors, for example, SiC, GaAs, InAs and InP. Typically, the substrate 100 may range in thickness, but not limited to, about hundreds of micrometers, for example, a thickness range from about 400 um to 800 um.

The fin 200 is formed by etching the substrate 200, such that the fin 200 is of the same material and crystal orientation as the substrate 100. Generally, the fin 200 has a length about 80-200 nm, and a width about 30-50 nm. The source region and the drain region are deposited in both ends of the fin 200 and they are of the same length. A channel is in the middle of the fin 200 and has a length about 30-50 nm, just between the source region and the drain region.

The gate structure comprises a gate dielectric layer, a work-function tuning layer and a gate electrode metal layer.

More details of the present invention will be described in the following with reference to the attached drawings. In the drawings identical elements are indicated by similar numbers. Each part of the drawings is not drawn to scale for purpose of clarity.

In the context of the present disclosure, when a layer/element is recited as being "on" a further layer/element, the layer/element can be disposed directly on the further layer/element, or otherwise there may be an intervening layer/element interposed there between. Further, if a layer/element is "on" a further layer/element in an orientation, then the layer/element can be "under" the further layer/element when the orientation is turned.

To describe a situation such as directly on another layer, another area, "on . . . " or "on . . . and adjacent to" is adopted in the specification.

Many particular details according to the present invention are described in the following, for example, device structure, material, dimension, operation process and technique, for purpose of clarity and comprehension. Those skilled in the art may understand the invention can be practiced by modifications and revisions not limited to the particular details.

Figure 1:
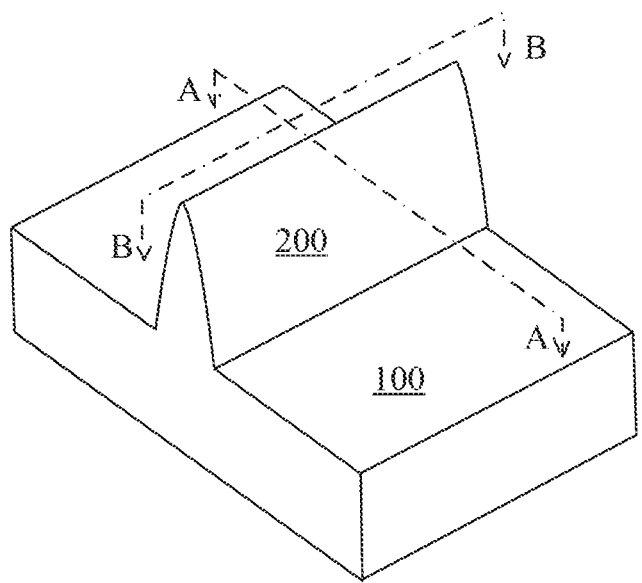
FIG. 1 and FIG. 12 are 3D isometric views illustrating some steps of a process for manufacturing a semiconductor fin structure in accordance with one embodiment of the present disclosure.

Referring to FIG. 1, the invention intends to fabricate a semiconductor fin 200 on the substrate 100. As an exemplary embodiment of the present invention, the substrate 100 and fin 200 are formed of Si. The fin 200 is formed by epitaxially growing a semiconductor layer on the substrate 100 and then etching the semiconductor layer, the epitaxy method may be Molecular Beam Epitaxy (MBE) or other methods and the etching method may be dry etching or dry/wet etching. The fin 200 has a height in a range about 100~150 nm.

Figure 3:
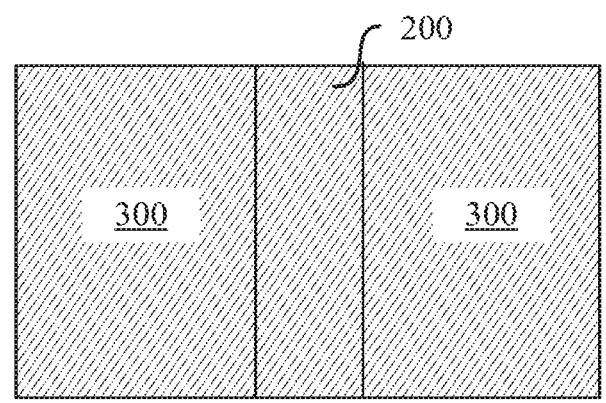
FIGS. 3, 10 and 11 are top views illustrating some steps of a process for manufacturing a semiconductor fin structure in accordance with one embodiment of the present disclosure.

Then, after the fin 200 formed, the semiconductor structure formed after the foregoing processes is isolated to form a shallow trench isolation 300 and FIG. 2 is a sectional view of the fin 200 along direction A-A. Preferably, firstly, a silicon nitride and buffer SiO$_2$ pattern are formed on the semiconductor fin 200 as a mask for later trench etching. Then, a trench with a specific depth and sidewall angle is formed in the substrate 100. Afterwards, a thin SiO$_2$ layer is grown to smooth the top corner of the trench and eliminate the damages in the surface of substrate introduced in the etching process. The trench is filled after the foregoing oxidation process, and the filling material may comprise SiO$_2$. Then a chemical mechanical polish (CMP) process is employed to planarize the surface of the substrate 100, as a result of the CMP process, the top surface of the shallow trench isolation 300 is in a higher position than the top surface of the fin 200 by 5-10 nm. FIG. 3 is a top view of the semiconductor structure formed by the foregoing steps.

Figure 4:
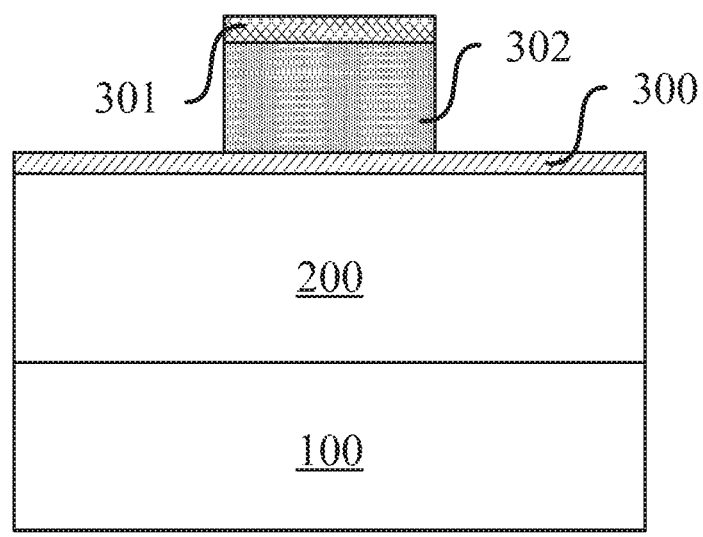

Then, a sacrificial gate stack is formed on the surface of the shallow trench isolation 300. The gate stack intersects with the fin 200 substantially vertically, and width of the gate stack is the same as the channel length in the fin 200. Specifically, the gate stack may comprise a single layer or a multiple layer. The gate stack may comprise polymer, amorphous silicon, polysilicon or TiN, and the thickness of the gate stack may range from 10-100 nm. A thermal oxidation, chemical vapor deposition (CVD) and atomic layer deposition (ALD) may be introduced to form the gate stack. In the embodiment, the gate stack comprises a polysilicon layer 302 and a SiO$_2$ layer 301. A cross-sectional view of the gate stack along B-B direction is shown in FIG. 4.

Alternatively, a spacer is formed along the sidewall of the gate stack to separate adjacent gate stacks. The spacer may comprise silicon nitride, silicon oxide, silicon oxynitride, silicon carbide and a combination thereof, and/or other appropriate materials. The spacer may be formed by various process including deposition and etching, and the thickness may be in a range from 10 to 100 nm, for example, 30 nm, 50 nm, or 80 nm.

Figure 5:
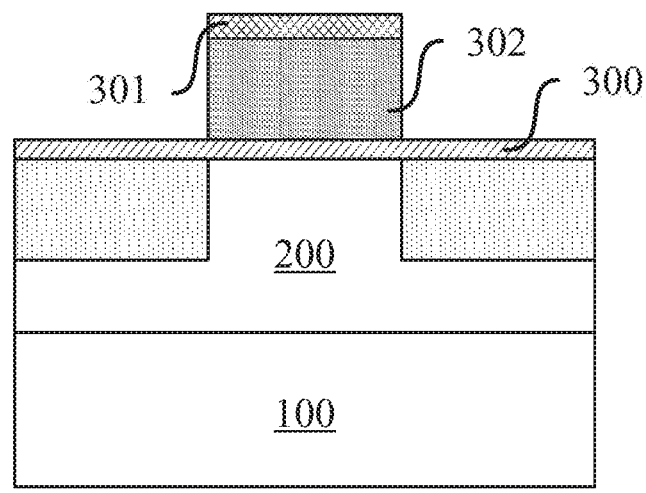

Afterwards, source and drain regions are formed on opposite side of the gate stack sidewall. In particular, an ion implantation is performed into the semiconductor structure with the sacrificial gate stack as a mask, using the shallow trench isolation 300 as a protective layer for the ion implantation to avoid damages in the fin surface introduced by the ion implantation. There is little difference of the ion implantation depth between Si and the SiO$_2$, therefore, heavily doped regions are formed both in the fin 200 which is not covered by the sacrificial gate stack and in the shallow trench isolation 300 after the ion implantation. Afterwards, referring to FIG. 5, an anneal process is performed to the semiconductor structure to active the source/drain ions in the fin 200 to form uniform doped source/drain regions. In particular, the anneal temperature may be 950° C., and the anneal time may be 15~30 minutes. FIG. 5 is a cross sectional view along B-B direction.

Figure 6:
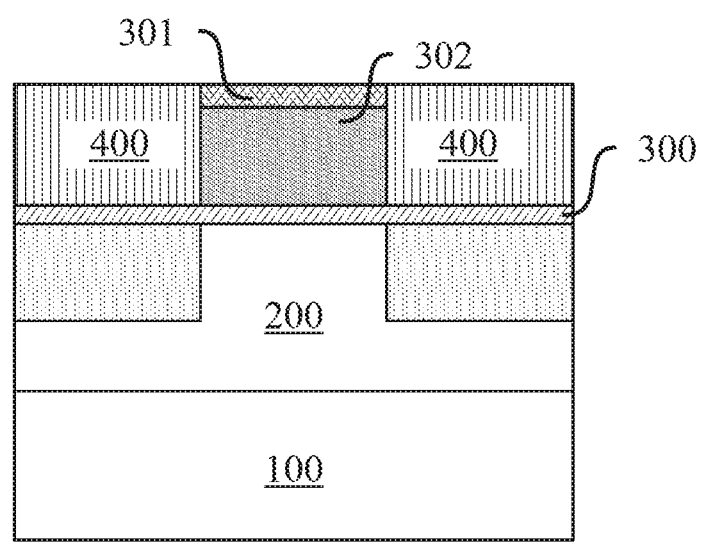

Then, referring to FIG. 6, an interlayer dielectric 400 is deposited and planarized to expose the sacrificial gate stack. Specifically, the interlayer dielectric 400 may be formed by chemical vapor deposition (CVD), high density plasma CVD, spin coating or other appropriate methods. Material for the interlayer dielectric 400 may include any one of SiO$_2$, carbon doped SiO$_2$, BPSG, PSG, UGS, Silicon oxynitride, low-k material or a combination thereof. The interlayer dielectric 400 ranges in thickness from 40 to 150 nm, for example, 80 nm, 100 nm, or 120 nm. Subsequently, a planarizing process is performed to expose the sacrificial gate stack, which levels with the interlayer dielectric 400 (The term "level with" is defined as that the difference in height is within the allowable deviation in semiconductor techno).

Figure 7:
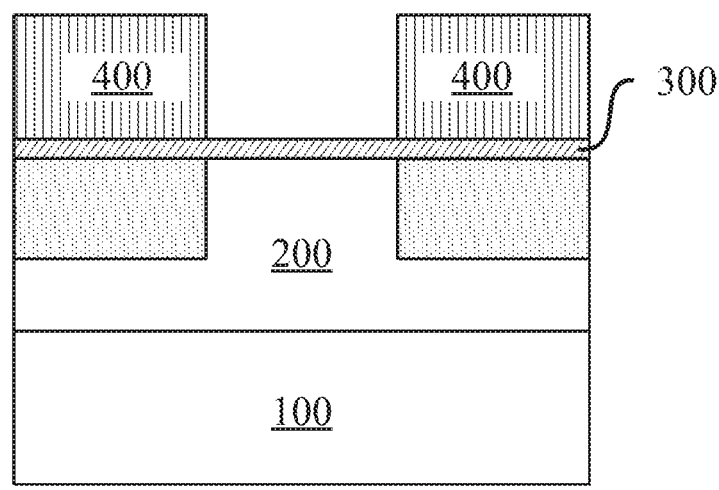
Figure 8:
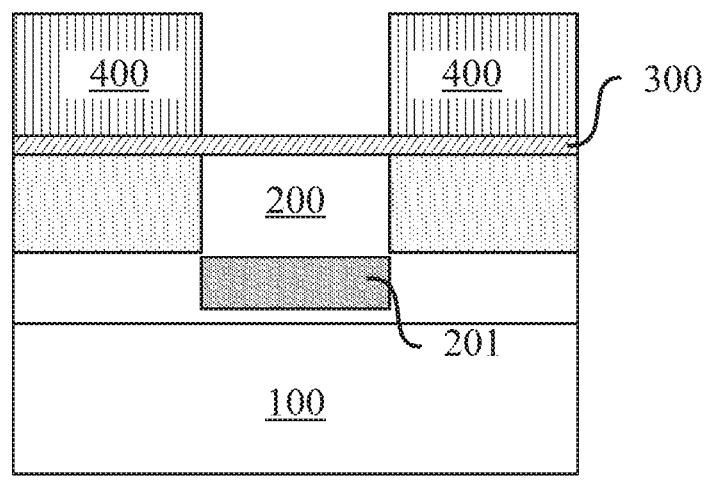

Afterwards, referring to FIG. 7, the sacrificial gate stack is removed to form a sacrificial gate vacancy and expose the surface of the shallow trench isolation 300 under the sacrificial gate stack. Specifically, a dry etching may be used to remove the sacrificial gate stack. Subsequent to the sacrificial gate stack removed, an ion implantation into the semiconductor structure takes place to form a doped region which is under the sacrificial gate vacancy by a depth range of about 20-60 nm. Particularly, the doping concentration of the doped region is 1e18 cm$^{-3}$~1e19 cm$^{-3}$, which is much higher than that of the substrate, for purpose of preventing punch through between the source and drain regions. Referring to FIG. 8, the doped region is in a lower position than the source/drain regions.

Figure 9:
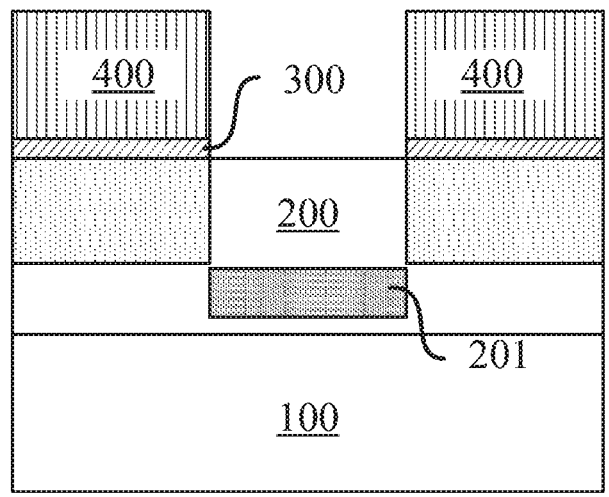
Figure 10:
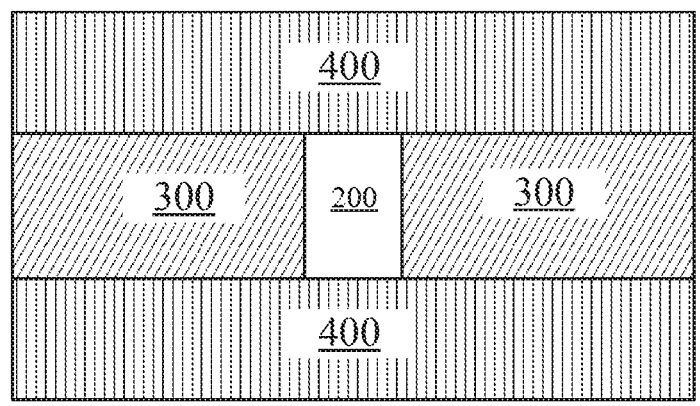

Next, referring to FIG. 9, a portion of the shallow trench isolation 300 under the sacrificial gate vacancy is removed to expose the channel region. In particular, wet etching and/or dry etching may be employed to remove the sacrificial gate stack. In an exemplary embodiment, a plasma etching is used. The depth of the portion of the shallow trench isolation 300 which has been removed is 20~60 nm, which is just the valid fin height in the embodiment and is smaller than the height of the fin 200. A top view of the semiconductor structure subsequent to the foregoing etching process is shown in FIG. 10.

Figure 11:
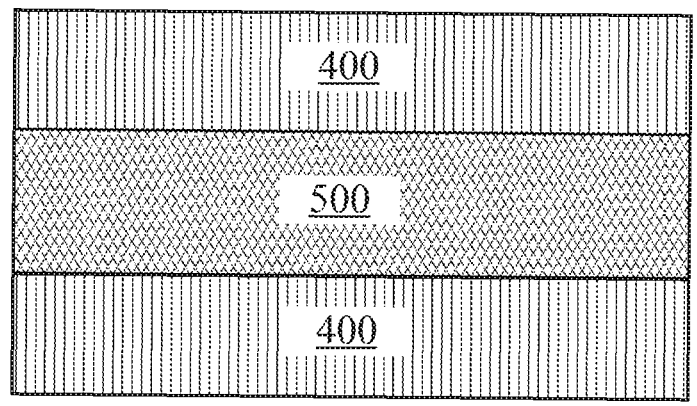
Figure 12:
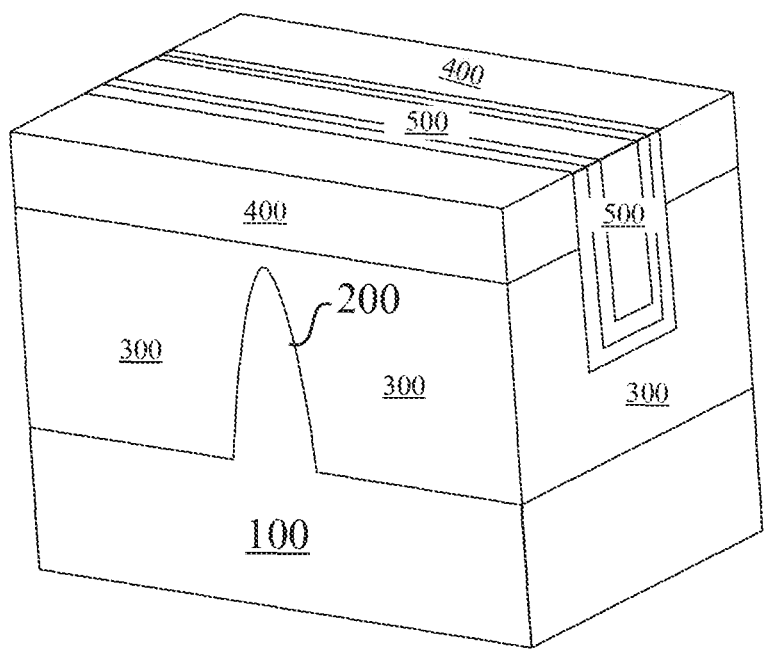

Next, referring to FIG. 11, a gate stack 500 is formed in the sacrificial gate vacancy, comprising a gate dielectric layer, a work-function tuning layer and a gate electrode metal layer. Specifically, the gate dielectric layer may be an oxidation layer, comprising silicon oxide, silicon oxynitride; alternatively a high-k dielectric layer, such as, HfAlON, HfSiAlON, HfTaAlON, HfTiAlON, HfON, HfSiON, HfTaON, HfTiON, Al2O3, La2O3, ZrO2, LaAlO or a combination thereof, and may ranges in thickness from 1 to 10 nm, for example, 3 nm, 5 nm or 8 nm. The work-function tuning layer may be formed by a material such as, TiN, TaN, and ranges in thickness from 3 to 15 nm. The gate electrode metal layer may comprise a single layer or a multiple layer, and be formed by one selected from a group of TaN, TaC, TiN, TaAlN, TiAlN, MoAlN, TaTbN, TaErN, TaYbN, TaSiN, HfSiN, MoSiN, RuTax and NiTax or any combination thereof. The gate metal layer ranges in thickness from 10 to 40 nm, for example, 20 nm or 30 nm. The semiconductor structure after the gate stack 500 formed is shown by FIG. 12.

A novel source/drain region doping method for a FinFET according to an embodiment of the present invention is provided, comprising: subsequent to a fin formation, forming a shallow trench isolation on the substrate, wherein the shallow trench isolation is higher than the fin, forming a sacrificial gate stack on the shallow trench isolation, next, forming source/drain regions below the gate stack and just in both ends of the fin which is embedded in the STI structures. Therefore, a similarly planar structure is formed. In the present invention, vertically ion implantation can be used to implement the source/drain doping and the under-channel doping to avoid punch through from the source region to the drain region. Some advantages of the current invention may be, harmful effects produced in the source/drain regions by the triangle fin structure can be eliminated, the device performance can be optimized, and process complexity can be reduced.

Although the invention has been described with reference to the exemplary embodiments and advantages, it is understood that various changes and replacements and revisions may be made to the embodiments without departing the spirit and scope of the appended claims. For other exemplary embodiments, those skilled in the art may understand the order of the process steps can be changed within the present invention in its aspects.

Further, the present invention is not intend to limited to the particular details described in the specification, such as, technology, mechanism, fabrication, material composition, means, methods and steps. Those skilled in the art will recognize that for those elements already existing or to be developed, such as technology, mechanism, fabrication, material composition, means, methods or steps, if the elements used to be implement a specific function or result similar to the embodiments of the present invention, they can be employed according to the present invention. Therefore, those technology, mechanism, fabrication, material composition, means, methods and steps are in the scope of the appended claims.

We claim:
1. A method of manufacturing a FinFET, comprising:
   a. providing a substrate (100);
   b. forming a fin (200) on the substrate (100);
   c. forming an shallow trench isolation (300) on both sides of the fin (200);
   d. forming a sacrificial gate stack on the shallow trench isolation (300), wherein the sacrificial gate stack intersects the fin (200);
   e. forming source/drain regions by ion implantation into the fin;
   f. depositing an interlayer dielectric layer (400) on the substrate (100);
   g. removing the sacrificial gate stack to form a sacrificial gate vacancy;
   h. forming an doped region (201) under the sacrificial gate vacancy;
   i. etching the shallow trench isolation (300) under the sacrificial gate vacancy until the top surface of the shallow trench isolation (300) levels with the bottom surface of the source/drain regions;
   j. forming a gate stack in the sacrificial gate vacancy.

2. The method of claim 1, in step c, wherein the top surface of the shallow trench isolation (300) is higher than that of the fin (200) by 5-10 nm.

3. The method of claim 1, wherein the shallow trench isolation (300) is made of $SiO_2$.

4. The method of claim 1, wherein the width of the sacrificial gate stack equals to the channel length in the fin (200).

5. The method of claim 1, in step i, wherein the etching depth is about 20-60 nm when etching the shallow trench isolation (300) under the sacrificial gate vacancy.

6. The method of claim 1, in step h, wherein the doped region (201) is under the sacrificial gate vacancy by a depth range of about 20-60 nm.

7. The method of claim 1, wherein an ion implantation process is employed to form the doping region (201).

8. The method of claim 6, wherein an ion implantation process is employed to form the doping region (201).

9. The method of claim 1, wherein the doping type of the doping region (201) is the same as that of the substrate.

10. The method of claim 6, wherein the doping type of the doping region (201) is the same as that of the substrate.

11. The method of claim 7, wherein the doping type of the doping region (201) is the same as that of the substrate.

12. The method of claim 8, wherein the doping type of the doping region (201) is the same as that of the substrate.

13. The method of claim 1, wherein the doping concentration of the doping region (201) is in a range of $1e18$ $cm^{-3}$~$1e19$ $cm^{-3}$.

14. The method of claim 6, wherein the doping concentration of the doping region (201) is in a range of $1e18$ $cm^{-3}$~$1e19$ $cm^{-3}$.

15. The method of claim 7, wherein the doping concentration of the doping region (201) is in a range of $1e18$ $cm^{-3}$~$1e19$ $cm^{-3}$.

16. The method of claim 8, wherein the doping concentration of the doping region (201) is in a range of $1e18$ $cm^{-3}$~$1e19$ $cm^{-3}$.

17. The method of claim 9, wherein the doping concentration of the doping region (201) is in a range of $1e18$ $cm^{-3}$~$1e19$ $cm^{-3}$.

18. The method of claim 10, wherein the doping concentration of the doping region (201) is in a range of $1e18$ $cm^{-3}$~$1e19$ $cm^{-3}$.

19. The method of claim 11, wherein the doping concentration of the doping region (201) is in a range of 1e18 cm$^{-3}$~1e19 cm$^{-3}$.

20. The method of claim 12, wherein the doping concentration of the doping region (201) is in a range of 1e18 cm$^{-3}$~1e19 cm$^{-3}$.

21. The method of claim 1, further including a step between step c and step d: planarizing the shallow trench isolation (300) on the substrate.

22. The method of claim 1, wherein the doping region (201) is in a lower position than the source/drain regions.

* * * * *